United States Patent
Choi et al.

(10) Patent No.: US 9,788,421 B2
(45) Date of Patent: Oct. 10, 2017

(54) PRINTED CIRCUIT BOARD AND METHOD OF MANUFACTURING SAME

(71) Applicant: Tyco Electronics AMP Korea Ltd, Gyungsangbuk-do (KR)

(72) Inventors: Yang Yoon Choi, Gyungsangbuk-Do (KR); Ok Ky Beak, Gyungsangbuk-Do (KR)

(73) Assignee: Tyco Electronics AMP Korea Ltd., Gyungsangbuk-Do (KR)

( * ) Notice: Subject to any disclaimer, the term of this patent is extended or adjusted under 35 U.S.C. 154(b) by 0 days.

(21) Appl. No.: 14/736,407

(22) Filed: Jun. 11, 2015

(65) Prior Publication Data

US 2015/0282292 A1 Oct. 1, 2015

Related U.S. Application Data

(63) Continuation of application No. PCT/KR2013/011248, filed on Dec. 6, 2013.

(30) Foreign Application Priority Data

Dec. 14, 2012 (KR) .......................... 10-2012-0146263

(51) Int. Cl.
*H05K 1/05* (2006.01)
*H05K 3/38* (2006.01)
(Continued)

(52) U.S. Cl.
CPC ........... *H05K 1/053* (2013.01); *H05K 1/0201* (2013.01); *H05K 1/0278* (2013.01); *H05K 1/09* (2013.01); *H05K 3/285* (2013.01); *H05K 3/421* (2013.01); *H05K 3/425* (2013.01); *H05K 3/429* (2013.01); *H05K 3/4608* (2013.01); *H05K 1/0207* (2013.01); *H05K 3/06* (2013.01); *H05K 2201/0323* (2013.01); (Continued)

(58) Field of Classification Search
CPC .......... H05K 1/05; H05K 1/053; H05K 3/385; H05K 3/44
See application file for complete search history.

(56) References Cited

U.S. PATENT DOCUMENTS

2005/0178669 A1 8/2005 Strubbe
2009/0133920 A1 5/2009 Kim et al.
2009/0277579 A1 11/2009 Ha

FOREIGN PATENT DOCUMENTS

JP 2006347990 A 12/2006
JP 2007-027618 A 1/2007
(Continued)

OTHER PUBLICATIONS

International Search Report, International Application No. PCT/KR2013/011248, dated Mar. 20, 2014, 2 pages.
European Search Report, dated Jul. 8, 2016, 9 pages.

*Primary Examiner* — Jeremy C Norris
(74) *Attorney, Agent, or Firm* — Barley Snyder

(57) ABSTRACT

A printed circuit board has a core made of an aluminum material; a bonding member positioned on opposite surfaces of the core; a base layer bonded to the opposite surface of the core through the bonding member; a receiving hole extending through the core, the bonding member, and the base layer; a zinc substitution layer positioned on a surface of the base layer and a portion of the base layer exposed on an inner surface of the receiving hole; and a plating layer positioned on the zinc substitution layer, and having a circuit pattern.

28 Claims, 9 Drawing Sheets

(51) Int. Cl.
  *H05K 1/02* (2006.01)
  *H05K 1/09* (2006.01)
  *H05K 3/28* (2006.01)
  *H05K 3/42* (2006.01)
  *H05K 3/46* (2006.01)
  *H05K 3/06* (2006.01)

(52) U.S. Cl.
  CPC . *H05K 2203/072* (2013.01); *H05K 2203/073* (2013.01); *H05K 2203/0723* (2013.01)

(56) References Cited

FOREIGN PATENT DOCUMENTS

| | | |
|---|---|---|
| JP | 2007-235015 A | 9/2007 |
| KR | 2012-151176 A | 8/2012 |

PRINTED CIRCUIT BOARD AND METHOD OF MANUFACTURING SAME

CROSS-REFERENCE TO RELATED APPLICATION

This application is a continuation of PCT International Application No. PCT/KR2013/011248, filed Dec. 6, 2013, and Korean Patent Application No. 10-2012-0146263, filed Dec. 14, 2012.

FIELD OF THE INVENTION

The invention is generally related to an aluminum-based printed circuit board, and, more specifically, to an aluminum-based printed circuit board having increased heat dissipation and bending strength properties.

BACKGROUND

In general, a printed circuit board (PCB) is a component in which electric wirings are integrated to allow various devices to be populated therein or to be electrically connected to one another. Technological developments have led to an increase in production of PCBs having various forms and functions. Demand for such PCBs has been increasing with a growth of industries using the PCBs and relating to, for example, home appliances, communication devices, semiconductor equipment, industrial machinery, and electrical control of vehicles. In addition, PCB products are being transformed into a miniaturized, light-weight, and high value-added products, as electronic components become smaller and more sophisticated.

As electronic components become increasingly more sophisticated and perform more complex functions, they consume increasing amounts of power, and, as a result, correspondingly generate greater amounts of heat. The levels of generated heat are such that they are becoming a factor used by consumers to evaluate a degree of satisfaction with the electronic product, and affect consumer purchasing habits.

Conventionally, a multilayer PCB is manufactured by using a copper-clad laminate (CCL) as a base substrate, forming a circuit pattern on the CCL, and laminating a layer. The use of copper (Cu) as a material for the base substrate which providing excellent conductivity, also limits the ability to improve heat dissipation characteristics of the PCB. When multilayer PCBs are required in an application, the conventional method of manufacturing with coper (Cu) becomes limiting, because of the resulting heat generated by the multilayer PCB.

SUMMARY

A printed circuit board has a core made of an aluminum material; a bonding member positioned on opposite surfaces of the core; a base layer bonded to the opposite surface of the core through the bonding member; a receiving hole extending through the core, the bonding member, and the base layer; a zinc substitution layer positioned on a surface of the base layer and a portion of the base layer exposed on an inner surface of the receiving hole; and a plating layer positioned on the zinc substitution layer, and having a circuit pattern.

BRIEF DESCRIPTION OF THE DRAWINGS

The invention will now be described by example, with reference to the accompanying Figures, of which.

DETAILED DESCRIPTION OF THE EMBODIMENT(S)

Figure 1:
FIG. 1 is a cross-sectional view of a first step of a method of manufacturing a printed circuit board having a metal core layer with a through hole.

Reference will now be made in detail to embodiments of the invention, examples of which are shown in the accompanying Figures, wherein like reference numerals refer to like elements. In descriptions of the embodiments provided herein, known functions or configurations can be omitted to clearly and concisely describe the invention.

Hereinafter, a method of manufacturing a printed circuit board (PCB) including a metal 101' core layer with a receiving hole 104 will be described in detail with reference to FIGS. 1 through 12. Unless indicated otherwise, a phrase "on a layer" is used for purposes of brevity and conciseness to refer to "on both an upper surface and a lower surface of the layer," as well as being used to refer to only one surface.

In an embodiment shown in FIG. 1, a metal core layer 101' is prepared. The metal core layer 101' is made of an aluminum material having a predetermined thickness. The metal core layer 101' includes one or more core patterns 100. The core pattern 100 can be predetermined pattern or a plurality of holes arranged regularly or irregularly. With the formation of the predetermined pattern, the core pattern 100 is a predetermined circuit pattern on the metal core layer 101'. In addition, the core pattern 100 serves to increase the surface are of the metal core layer 101', resulting in an increase in desirable heat radiation from the metal core layer 101'. The core pattern 100 is formed on the metal core layer 101' through a chemical or mechanical method. In an embodiment, the core pattern 100 is formed on the metal core layer 101 through chemical etching. In another embodiment, the core pattern 100 can be formed as a hole by punching the metal core layer 101'.

Figure 2:
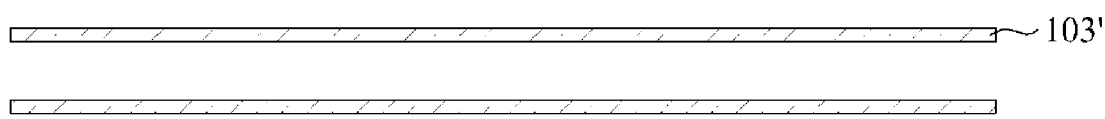
FIG. 2 is a cross-sectional view of a second step of the method in FIG. 1.

In an embodiment shown in FIG. 2, a base layer 103' is prepared. The base layer 103' is made of an aluminum foil having a predetermined thickness.

Figure 3:
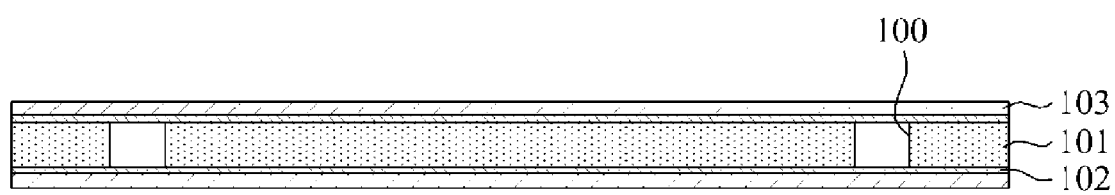
FIG. 3 is a cross-sectional view of a third step of the method in FIG. 1.

In an embodiment shown in FIG. 3, the separately prepared base layer 103' is then bonded on both the upper and lower surfaces of a metal core layer 101 to form a base layer 103. The base layer 103 is bonded onto the metal core layer 101 using a bonding member 102, which is applied to the metal core layer 101 prior to the base layer 103.

The bonding member 102 can be a polyimide-based insulating bonding sheet, which is a binder having a desirable bonding performance and insulating function, or an epoxy, such as glass epoxy resin. The polyimide-based insulating bonding sheet and the epoxy are materials have a thermal expansion coefficient similar to a thermal expansion coefficient of the base layer 103, making them suitable for use as the bonding member 102. In other embodiments, the bonding member 102 can be other materials having similar thermal expansion coefficients. The polyimide endures at a high temperature of 400° C. or above or at a low temperature of −269° C., allowing the polyimide material to absorb heat at a change rate based on a thermal expansion coefficient of aluminum, for example, 23.03×10-6° C. Thus, to bond the base layer 103 onto the metal core layer 101, a predetermined temperature and pressure can be applied to the base layer 103.

In an embodiment, a surface treatment can be performed to form surface roughness on each of the metal core layer 101' and the base layer 103' prepared with reference to FIGS. 1 and 2, in order to improve a bonding performance between the bonding member 102 and the metal core layer 101, and between the bonding member 102 and the base layer 103. For example, soft etching can be performed on a surface of the metal core layer 101' on which surface roughness is not formed using a sulfuric acid type. Alternatively, oxidation treatment can be performed to form the surface roughness. Similarly, soft etching can be performed to form surface roughness on a surface of the base layer 103' on which surface roughness is not formed using a sulfuric acid type. Alternatively, an oxidation treatment can be performed to form the surface roughness.

Figure 4:
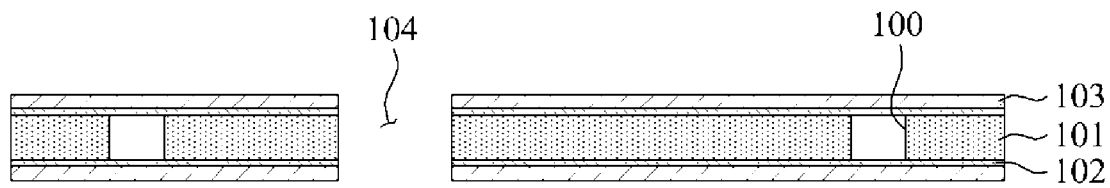
FIG. 4 is a cross-sectional view of a fourth step of the method in FIG. 1.

In an embodiment shown in FIG. 4, the receiving hole 104 is positioned to penetrate and extend through the metal core layer 101 and the base layer 103 in a state in which the base layer 103 is bonded onto the metal core layer 101. The receiving hole 104 can be formed by drilling or laser processing.

Figure 5:
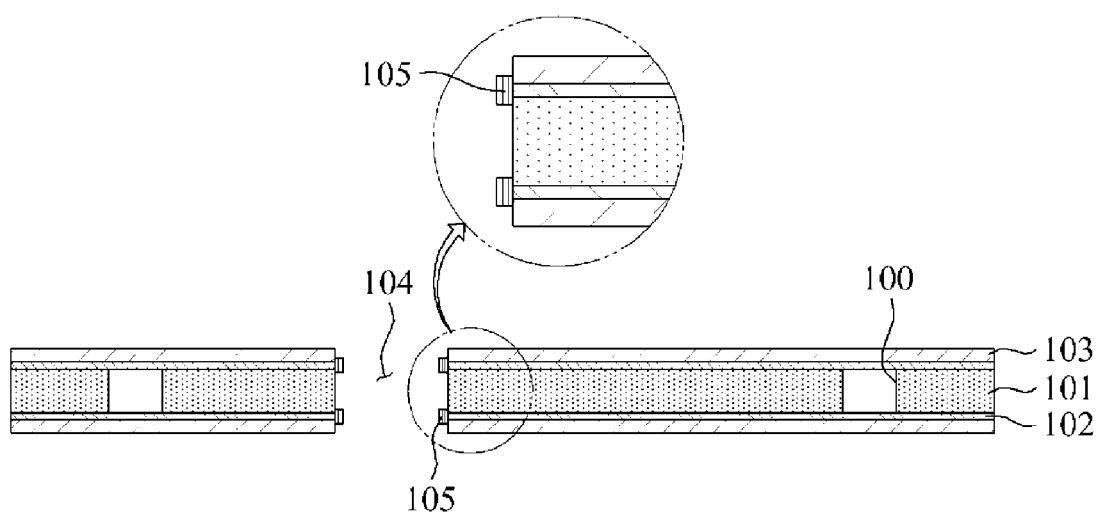
FIG. 5 is a cross-sectional view of a fifth step of the method in FIG. 1.

In an embodiment shown in FIG. 5, a metal layer 105 is deposited on a portion of the bonding member 102 exposed on an inner surface of the receiving hole 104. For example, a carbon plating layer can be formed on the metal layer 105 through carbon direct plating. With the formation of the metal layer 105, the base layer 103 positioned on and below the metal core layer 101 can be electrically connected through the metal core layer 101. As shown in FIG. 5, the metal layer 105 is connect to a portion of the metal core layer 101 and the base layer 103 to allow the metal layer 105 to electrically connect the metal core layer 101 and the base layer 103.

Figure 6:
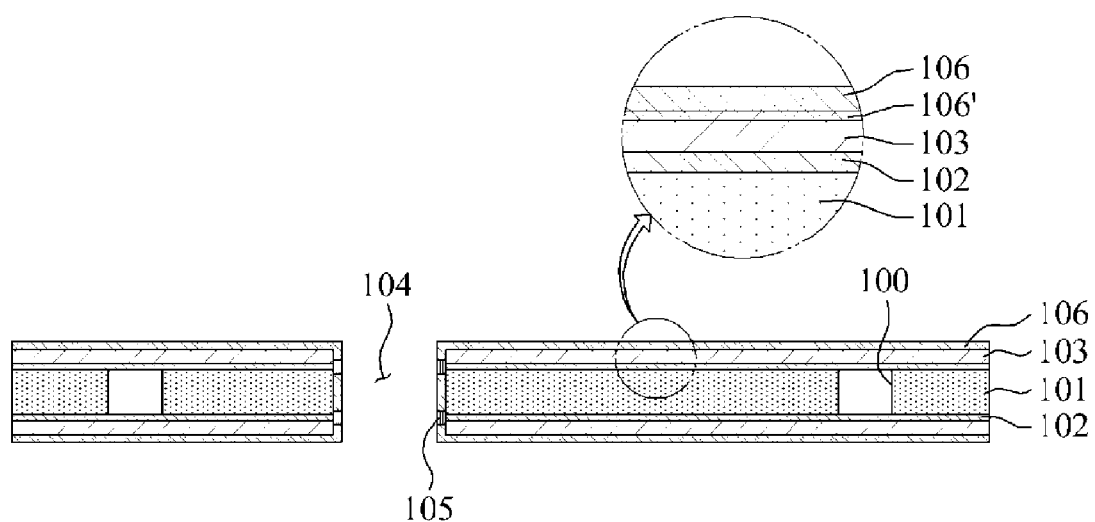
FIG. 6 is a cross-sectional view of a sixth step of the method in FIG. 1.

In an embodiment shown in FIG. 6, a zinc substitution layer 106 having a predetermined thickness is formed by performing zincate treatment on an outer surface of the base layer 103 after the metal layer 105 is formed. The substitution layer 106 is formed through a portion of the surface of the base layer 103 being substituted by a zinc film. The substitution layer 106 is positioned on an area from which the metal layer 105 is excluded, for example, the surface of the base layer 103 and a cross-sectional portion of the base layer 103 and the metal core layer 101, which is exposed to the inner surface of the receiving hole 104.

In an embodiment, the substitution layer 106 has a thickness equal to a thickness of the metal layer 105. As shown in FIG. 6 as reference No. 106', the substitution layer 106 is formed by a portion of a surface thickness of the base layer 103 being substituted. However, the invention is not limited to the shown embodiment, and in other embodiments, the thickness of the substitution layer 106 and the thickness of the base layer 103 to be substituted as illustrated as 106' can vary.

With the formation of the substitution layer 106, aluminum is prevented from becoming oxidized in an atmosphere and thus, the surface of the base layer 103 can be protected. In addition, by substituting the zinc film for the surface of the base layer 103, corrosion of the surface of the base layer 103 that can occur during subsequent electroless plating can be prevented.

Figure 7:
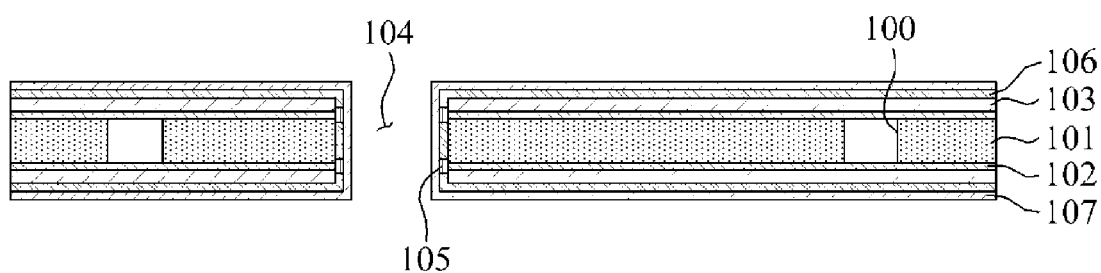
FIG. 7 is a cross-sectional view of a seventh step of the method in FIG. 1.

In an embodiment shown in FIG. 7, a plating layer 107 is deposited on the substitution layer 106. The plating layer 107 is also deposited on a surface of the metal layer 105 in the receiving hole 104. The plating layer 107 is formed using electrolytic or electroless plating.

The plating layer 107 is deposited by performing displacement plating on the substitution layer 106 using a metal film having a strong chemical resistance. For example, the plating layer 107 is deposited by performing the displacement plating using nickel (Ni) to substitute a nickel film for the substitution layer 106. However, the displacement plating is not limited to using nickel. Other metals having a strong chemical resistance, such as gold (Au) and silver (Ag), can be used to perform the displacement plating.

Although a partial thickness of the substitution layer 106 is substituted by the nickel film through the nickel displacement plating, the invention is not limited thereto. In another embodiment, both the metal layer 105 and the substitution layer 106 are substituted with the plating layer 107.

In an embodiment, the plating layer 107 is deposited only on the substitution layer 106 apart from the metal layer 105.

In another embodiment, the plating layer 107 is deposited to cover a portion or an entirety of the metal layer 105.

Figure 8:
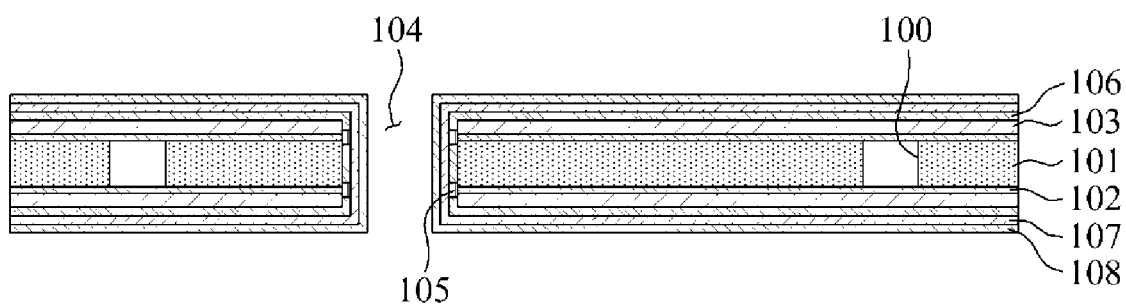
FIG. 8 is a cross-sectional view of an eight step of the method in FIG. 1.

In an embodiment shown in FIG. 8, an electrolytic plating layer 108 is deposited on the plating layer 107 using electrolytic plating. The electrolytic plating layer 108 is also deposited on the plating layer 107 in the receiving hole 104. The electrolytic plating layer 108 is a copper film formed by copper plating. The electrolytic plating layer 108 has a thickness of 20 micrometers (μm) or more.

The metal layer 105 is covered by at least one of the plating layer 107 and the electrolytic plating layer 108. For example, when the plating layer 107 is deposited only on the portion of the substitution layer 106 positioned apart from the metal layer 105, the electrolytic plating layer 108 covers both the plating layer 107 and the metal layer 105. Thus, in this example, only the electrolytic plating layer 108 is deposited on the metal layer 105. When the plating layer 107 covers a portion of the metal layer 105, the electrolytic plating layer 108 covers both the plating layer 107 and the metal layer 105. When the plating layer 107 fully covers the metal layer 105, the electrolytic plating layer 108 covers the plating layer 107. Thus, in this example, a double layer of the plating layer 107 and the electrolytic plating layer 108 is on the metal layer 105.

By forming the substitution layer 106 first, a binding strength between the substitution layer 106 and the base layer 103, and the substitution layer 106 and the plating layers, for example, the plating layer 107 and the electrolytic plating layer 108, can be improved. Thus, separation of the plating layer 107 and the electrolytic plating layer 108 from one another due to vibration can be effectively prevented, and accordingly, can be suitably used in an environment such as in a vehicle in which a great amount of vibration occurs.

Figure 9:
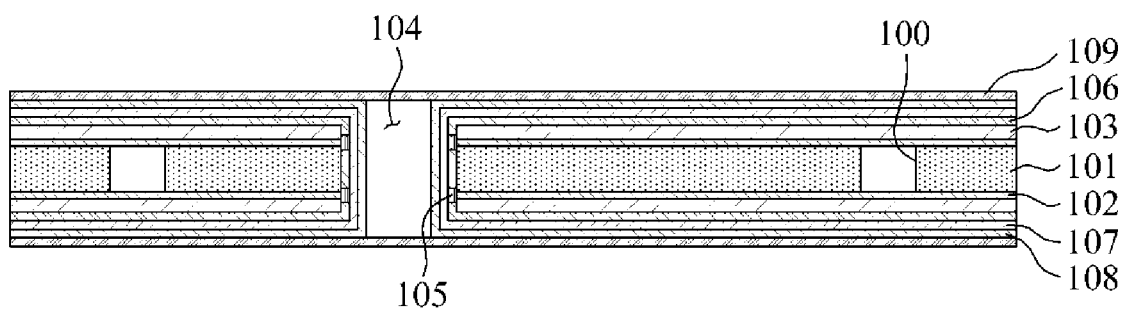
FIG. 9 is a cross-sectional view of a ninth step of the method in FIG. 1.
Figure 10:
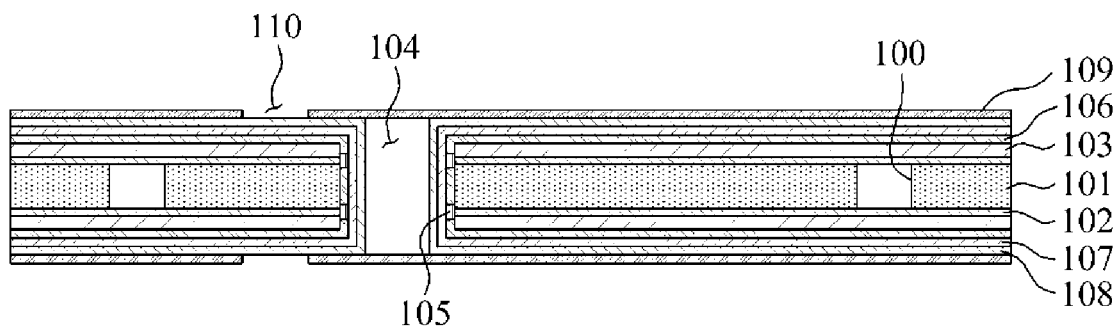
FIG. 10 is a cross-sectional view of a tenth step of the method in FIG. 1.

In the embodiments shown FIGS. 9 and 10, a dry film 109 is applied onto a surface of the electrolytic plating layer 108 to form a predetermined pattern 110. For example, the pattern 110 of the dry film 109 is formed by printing a pattern on the dry film 109 and performing exposure and development for a predetermined amount of time.

Figure 11:
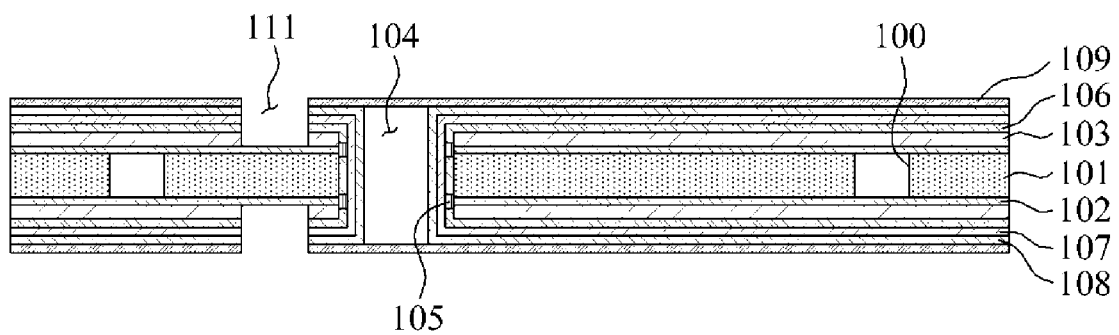
FIG. 11 is a cross-sectional view of an eleventh step of the method in FIG. 1.
Figure 12:
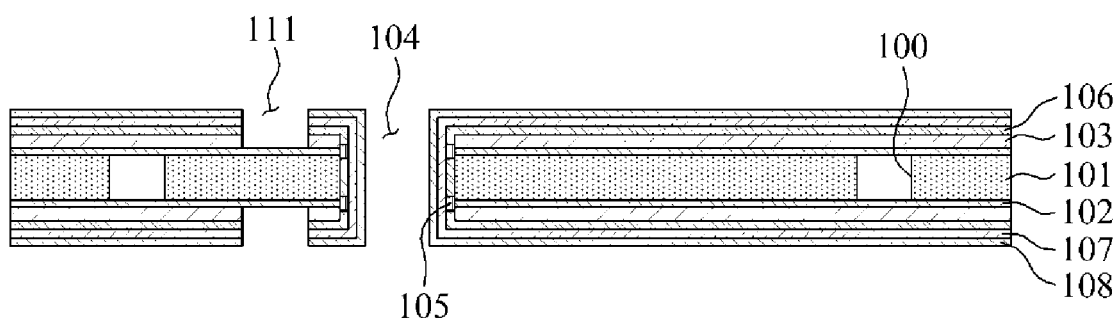
FIG. 12 is a cross-sectional view of a twelfth step of the method in FIG. 1.

In the embodiments shown in FIGS. 11 and 12, the electrolytic plating layer 108, the plating layer 107, the substitution layer 106, and the base layer 103 are removed along the pattern 110 of the dry film 109 to form a predetermined circuit pattern 111. Subsequent to the formation of the circuit pattern 111, the dry film 109 is removed to form a PCB in which the circuit pattern 111 is formed. In an embodiment, the circuit pattern 111 is formed using hydrochloric acid-based acidic etching based on the pattern 110 on the dry film 109. Examples of the hydrochloric acid type includes ferric chloride, cupric chloride, and sodium chlorate.

As described in the foregoing, the circuit pattern 110 can be formed using a mechanical method, such as punching, in addition to using a chemical method using the dry film 109 and the hydrochloric acid-based acidic etching.

The PCB manufactured in accordance with the method described with reference to FIGS. 1 through 12 can be applied to electronic components for a vehicle.

Hereinafter, a method of manufacturing a multilayer PCB using the PCB manufactured using the method described with reference to FIGS. 1 through 12 will be described.

In an embodiment shown in FIG. 13, an insulation layer 112 of an insulating material is formed on the PCB manufactured using the method described with reference to FIGS. 1 through 12. The insulation layer 112 is formed to fill both the receiving hole 104 and the circuit pattern 111 of the PCB.

Figure 14:
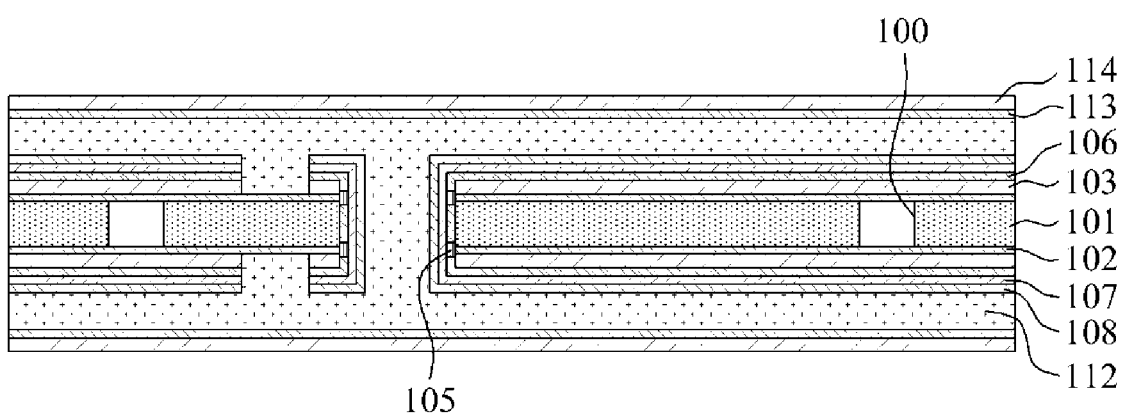
FIG. 14 is a cross-sectional view of a second step of the method in FIG. 13.

In an embodiment shown in FIG. 14, a base layer 114 is formed on the insulation layer 112. The base layer 114 is formed on an upper surface and a lower surface of the insulation layer 112. In an embodiment, an aluminum foil having a predetermined thickness is used as the base layer 114. To improve a bonding performance of a surface of the base layer 114, surface roughness is formed on the base layer 114 using sulfuric acid-based soft etching or oxidation treatment.

To bond the base layer 114 onto the insulation layer 112, a bonding member 113 such as the polyimide-based insulating bonding sheet or epoxy is be used. Surface treatment is performed to improve the surface roughness in order to improve binding strength between the base layer 114 and the bonding member 113.

Figure 15:
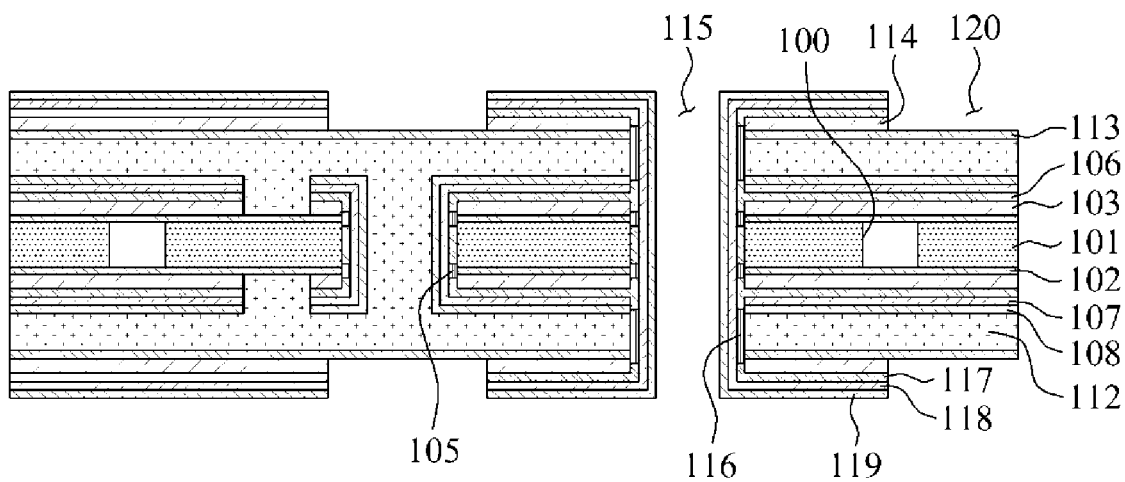
FIG. 15 is a cross-sectional view of a third step of the method in FIG. 13.

In an embodiment of FIG. 15, in a state in which the insulation layer 112, the bonding member 113, and the base layer 114 are formed in the PCB, a second receiving hole 115 is formed, and a metal layer 116, a substitution layer 117, a plating layer 118, and an electrolytic plating layer 119 are sequentially formed. Subsequently, a predetermined circuit pattern 120 is formed using a dry film to form the multilayer PCB. For a method of forming the second receiving hole 115 and the circuit pattern 120, reference is made to the descriptions provided with reference to FIGS. 4 through 12 and thus, repeated descriptions are omitted here for brevity.

The circuit pattern 120 is formed using a chemical method, through the use of the dry film and hydrochloride acid-based acidic etching. The chemical method selectively removes at least one or more of the electrolytic plating layer 119, the plating layer 118, the substitution layer 117, and up to the base layer 114 for the circuit pattern 120.

In an embodiment, a mechanical method using punching and the like is used, in addition to the chemical method, to form a circuit pattern on a based layer to be formed in a multilayer PCB. In addition, a through hole can be formed to connect an electrode or a metal layer in a predetermined form.

Although forming a double-layered PCB is shown, the invention is not limited thereto. Those of ordinary skill in the art would appreciate that a multilayer PCB having three or more layers can be formed by repetitively performing operations described with reference to FIGS. 13 through 15.

Figure 13:
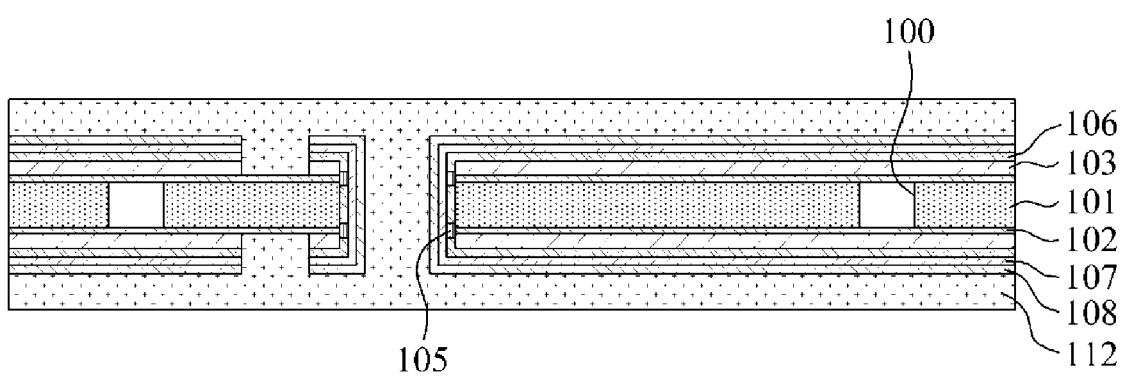
FIG. 13 is a cross-sectional view of a first step of a method of manufacturing a multilayer printed circuit board using the printed circuit board of FIGS. 1-12.

In the shown in embodiments, the inner layers in the multilayer PCB formed using the method described with reference to FIGS. 13 through 15 are electrically connected. A detailed method for such electrical connections among the inner layers will be described with reference to FIGS. 16 and 17.

Figure 16:
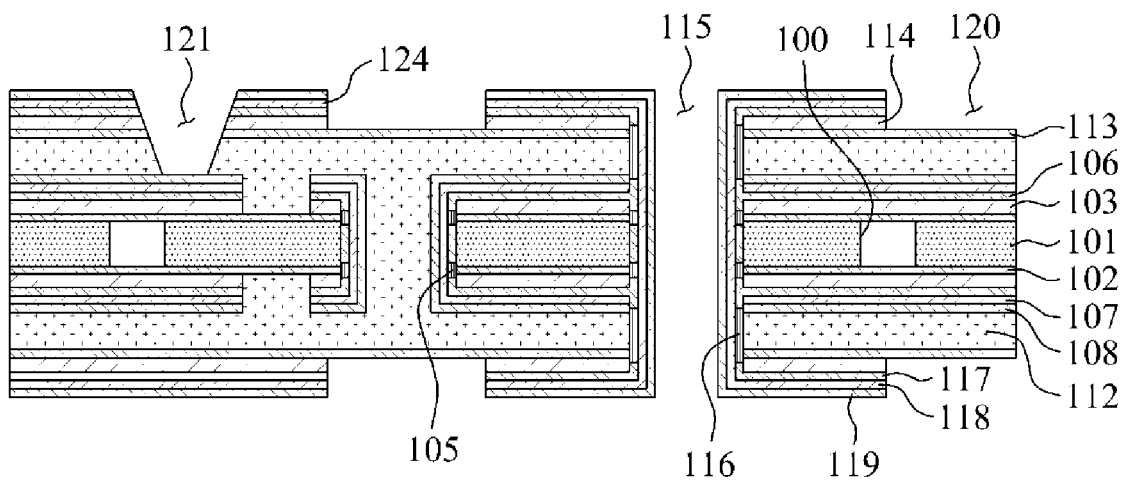
FIG. 16 is a cross-sectional view of a first step of a method of electrically connecting an inner layer of the multilayer printed circuit board of FIGS. 13-15.

In an embodiment shown in FIG. 16, a third receiving hole 121 is formed to assist in the electrical conduction in the manufactured multilayer PCB. The third receiving hole 121 electrically connects a circuit pattern of a PCB formed inside to a circuit pattern of a PCB layered on the PCB formed internally. For such an electrical conduction, the third receiving hole 121 is formed to allow the electrolytic plating layer 108 to be exposed through the third receiving hole 121 by removing all the electrolytic plating layer 119, the plating layer 118, the substitution layer 117, the base layer 114, the bonding member 113, and the insulation layer 112. The third receiving hole 121 can be formed by drilling or laser processing.

Figure 17:
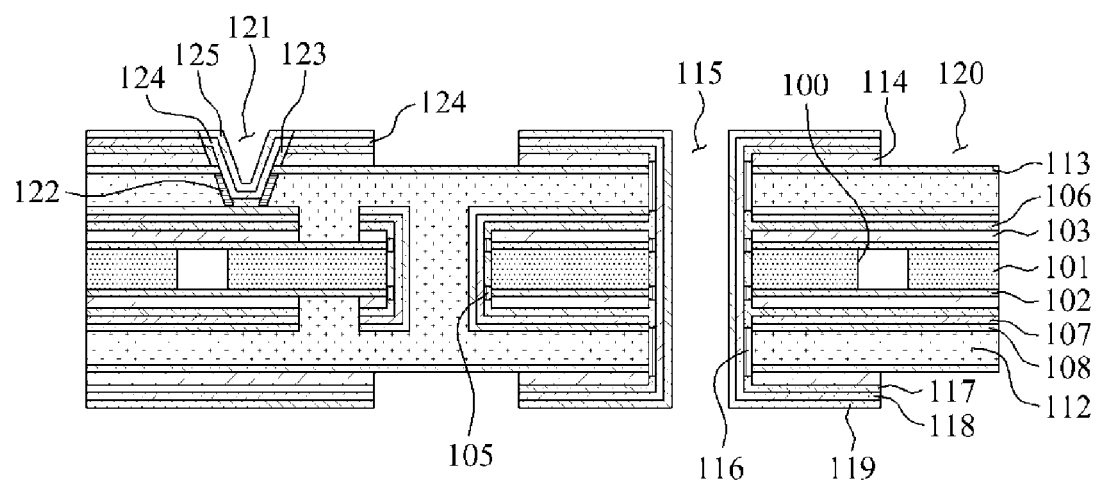
FIG. 17 is a cross-sectional view of a second step of the method of FIG. 16.

In an embodiment shown in FIG. 17, a metal layer 122 is deposited on a surface of the insulation layer 112 and the bonding member 113, which is exposed on an inner surface of the third receiving hole 121. A substitution layer 123, a plating layer 124, and an electrolytic plating layer 125 are then sequentially formed. Methods of forming the metal layer 122, the substitution layer 123, the plating layer 124, and the electrolytic plating layer 125 are referenced to the method descriptions provided with reference to FIGS. 5 through 8 and thus, repeated descriptions are omitted here for brevity.

The metal layer 122 electrically connects the electrolytic plating layer 108 in the third receiving hole 121 to the electrolytic plating layer 119 positioned outside of the third receiving hole 121. The metal layer 122 thereby functions as a conducting wire or mechanism that electrically connects an internal PCB and a layered PCB.

A thickness of the substitution layer 123, the plating layer 124, and the electrolytic plating layer 125 in the third receiving hole 121 is equal to a thickness of the substitution layer 117, the plating layer 118, and the electrolytic plating layer 119 formed in the layered PCB.

In an embodiment, the plating layer 123 and the electrolytic plating layer 124 cover the metal layer 122 in the third receiving hole 121. In an embodiment, the plating layer 123 does not cover the metal layer 122, and the electrolytic plating layer 124 fully covers the metal layer 122. In an embodiment, the plating layer 123 covers a portion of the metal layer 122, and the electrolytic plating layer 124 covers the metal layer 122 and the plating layer 123. When the plating layer 123 fully covers the metal layer 122, the electrolytic plating layer 124 is deposited on an upper surface of the plating layer 123. That is, the metal layer 122 is covered by at least one of the plating layer 123 and the electrolytic plating layer 124.

Although a method of manufacturing a PCB and a multilayer PCB with a receiving hole is described in the foregoing embodiments, the method can be identically applicable to a case in which the receiving hole is not formed. Hereinafter, a method of manufacturing a PCB including a metal core layer without a receiving hole will be described in detail with reference to FIGS. 18 through 24. The embodiments described with reference to FIGS. 1 through 12 are substantially identical to embodiments to be described hereinafter, except for an absence of the receiving hole.

Figure 18:
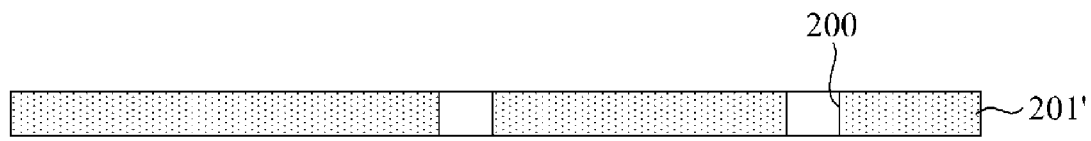
FIG. 18 is a cross-sectional view of a first step of a method of manufacturing a PCB having a metal core layer.

In an embodiment shown in FIG. 18, a metal core layer 201' is made of an aluminum material with a predetermined thickness. A core pattern 200 is formed as at least one hole in the metal core layer 201'. The core pattern 200 can be formed as a predetermined pattern or formed with a plurality of holes arranged regularly or irregularly. With the formation of the predetermined pattern, the core pattern 200 serves as a predetermined circuit pattern on the metal core layer 201'. In addition, the core pattern 200 allows heat to be desirably radiated from the metal core layer 201'. In an embodiment, the core pattern 200 is formed on the metal core layer 201' using a chemical method such as chemical etching, or mechanical method such as mechanical punching.

Figure 19:
FIG. 19 is a cross-sectional view of a second step of the method of FIG. 18.

In an embodiment of FIG. 19, a base layer 203' is formed using an aluminum foil having a predetermined thickness.

Figure 20:
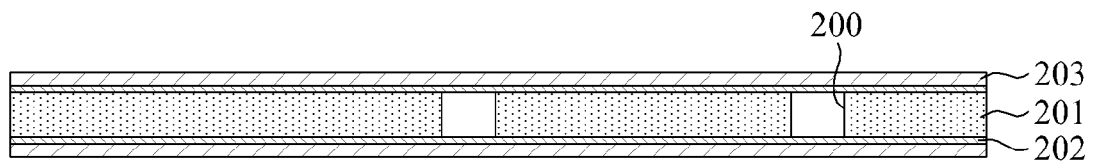
FIG. 20 is a cross-sectional view of a third step of the method of FIG. 18.

In FIG. 20, the base layer 203' is bonded on both surfaces of a metal core layer 201 to form a base layer 203. The base layer 203 is bonded onto the metal core layer 201 using a bonding member 202, such as the above discussed polyimide-based insulating bonding sheet or epoxy.

A surface treatment is performed to create surface roughness on each of the metal core layer 201' and the base layer 203' in order to improve a bonding performance between the bonding member 202 and the metal core layer 201, and the bonding member 202 and the base layer 203. For example, soft etching can be performed on a surface of the metal core layer 201' using a sulfuric acid type or oxidation treatment.

Similarly, soft etching can be performed on a surface of the base layer 203' using a sulfuric acid type or oxidation treatment.

Figure 21:
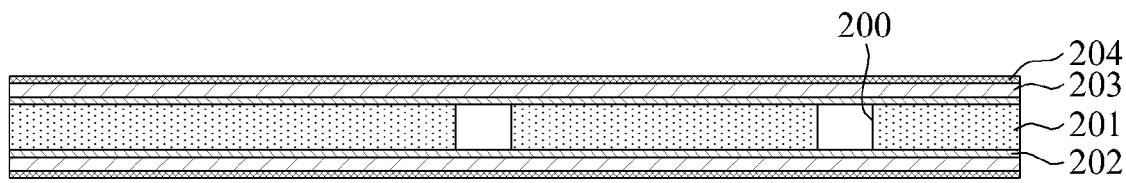
FIG. 21 is a cross-sectional view of a fourth step of the method of FIG. 18.
Figure 22:
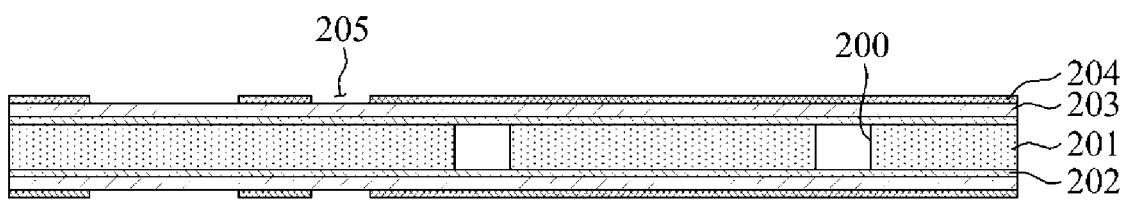
FIG. 22 is a cross-sectional view of a fifth step of the method of FIG. 18.

In the embodiments shown in FIGS. 21 and 22, a dry film 204 is applied onto the base layer 203. A predetermined pattern 205 is then formed through exposure and development.

Figure 23:
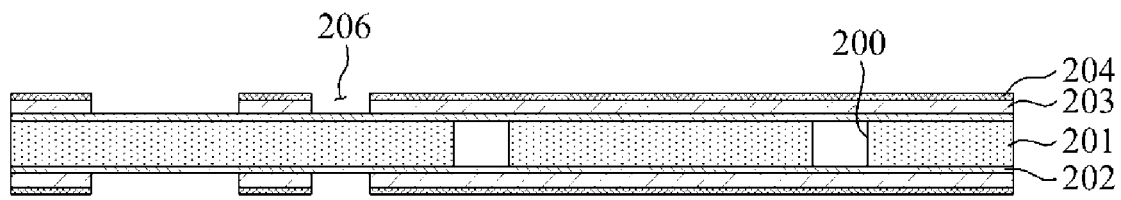
FIG. 23 is a cross-sectional view of a sixth step of the method of FIG. 18.
Figure 24:
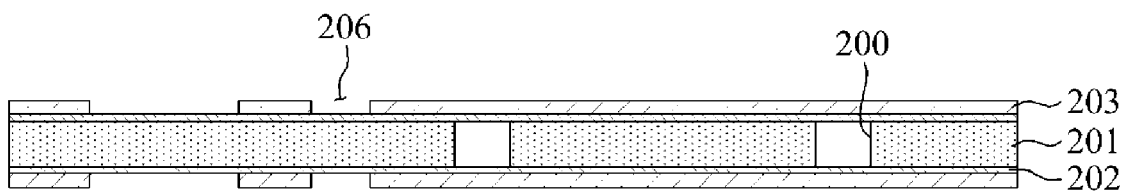
FIG. 24 is a cross-sectional view of a seventh step of the method of FIG. 18.

In the embodiments shown in FIGS. 23 and 24, a circuit pattern 206 is created by removing the base layer 203, based on the pattern 205 of the dry film 204. A PCB is thus formed by removing the dry film 204.

Although embodiments of forming a circuit pattern directly on the base layer 203 has described, the invention is not limited to the provided example. Instead, those of ordinary skill in the art would appreciate that a plating layer can be deposited on the base layer 203 using electrolytic or electroless plating.

The circuit pattern 206 is formed through a chemical method using the hydrochloride acid-based acidic etching and the dry film 204. Alternatively, the circuit pattern 206 can be formed through a mechanical method such as punching. Further still, the circuit pattern 206 can be formed as a through hole to connect an electrode or a metal layer in a predetermined form.

Figure 25:
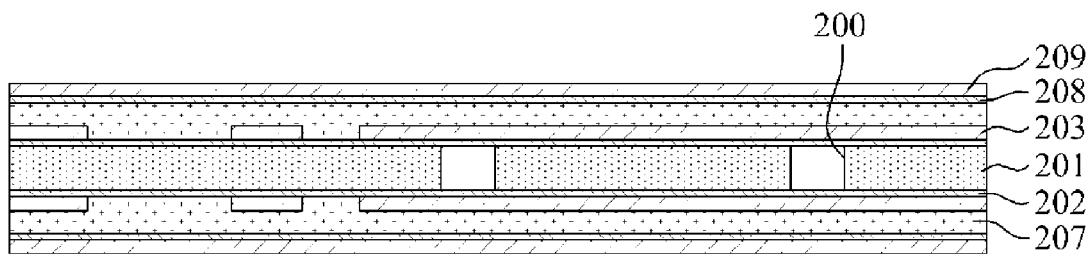
FIG. 25 is a cross-sectional view of a first step of a method of manufacturing a multilayer printed circuit board using the printed circuit board of FIGS. 18-24.
Figure 26:
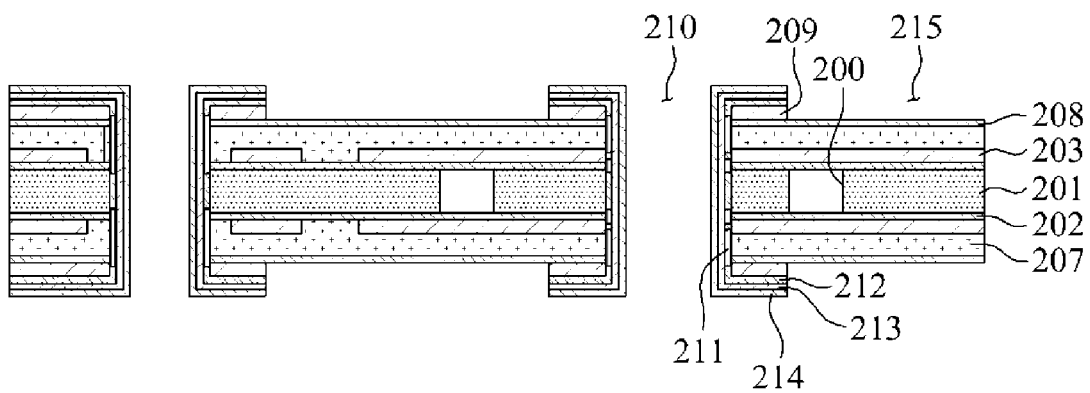
FIG. 26 is a cross-sectional view of a second step of the method of FIG. 25.
Figure 27:
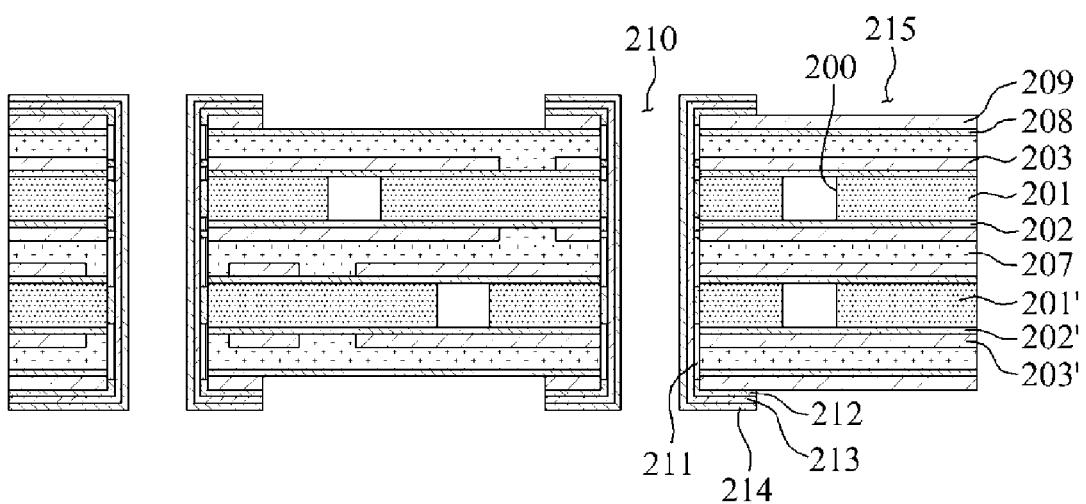
FIG. 27 is a cross-sectional view of a third step of the method of FIG. 25.

In the embodiments of FIGS. 25-27, a method of manufacturing is described for a multilayer PCB using the PCB manufactured using the method described with reference to FIGS. 17 through 24.

As shown in an embodiment of FIG. 25, an insulation layer 207 having a predetermined thickness fills the circuit pattern 206 of the PCB manufactured using the method described with reference to FIGS. 17 through 24. A base layer 209 is bonded onto the insulation layer 207 using a bonding member 208. The base layer 209 is an aluminum foil having a predetermined thickness, and the bonding member 208 is the polyimide-based insulating bonding sheet or epoxy.

In an embodiment shown in FIG. 26, a receiving hole 210 penetrates and extends through the PCB in which the insulation layer 207, the bonding member 208, and the base layer 209 are formed. The receiving hole 210 can be formed by drilling or laser processing. A metal layer 211 is formed to metalize a cross-sectional portion of the insulation layer 207 and the bonding member 208, which is exposed to an inner side of the receiving hole 210. A substitution layer 212, a plating layer 213, and an electrolytic plating layer 214 are sequentially formed.

The metal layer 211 connects to a portion of the metal core layer 201 and the base layer 203 disposed on both sides of the insulation layer 207 and the bonding member 208, in addition to a portion of the insulation layer 207 and the bonding member 208, and electrically connects the metal core layer 201 and the base layer 203. In addition, the metal layer is covered by at least one of the plating layer 213 and the electrolytic plating layer 214.

For a method of forming the metal layer 211, the substitution layer 212, the plating layer 213, and the electrolytic plating layer 214, reference is made to the descriptions provided above with respect to FIGS. 5-8 and thus, repeated descriptions are omitted here for brevity.

A dry film is applied onto the electrolytic plating layer 214, and a predetermined pattern is formed through exposure and development for a predetermined amount of time. A predetermined circuit pattern is formed using the dry film on which the pattern is formed. The circuit pattern is formed by removing the electrolytic plating layer 214, the plating layer 213, the substitution layer 212, and up to the base layer 209 using hydrochloride acid-based acidic etching using the dry film.

In an embodiment, the circuit pattern is formed through a chemical method using hydrochloride acid-based acidic etching using the dry film. The chemical method selectively removes the base layer 209 in addition to the electrolytic plating layer 214, the plating layer 213, and the substitution layer 212.

In another embodiment, a mechanical method such as punching is used to form a predetermined pattern on a base layer to be layered in a multilayer PCB. Alternatively, only a through hole can be formed to connect an electrode or a metal layer in a predetermined form.

Although an example of forming a double-layered PCB is described, a multilayer PCB, such as a PCB with three or more layers, can be formed by repetitively performing operations described with reference to FIGS. 25 and 26. Referring to the embodiment of FIG. 27, a high multilayer PCB is formed by layering two PCBs manufactured using the method described with reference to FIGS. 17-24. Alternatively, a multilayer PCB is formed by layering at least three PCBs using a method to be described with reference to FIG. 27. As described with reference to FIGS. 25 and 26, the multilayer PCB of FIG. 27 is formed by positioning the insulation layer 207 between the PCBs to be bonded to each other, forming the base layer 209 on the insulation layer 207 using the bonding member 208, and sequentially forming the metal layer 211, the substitution layer 212, the plating layer 213, and the electrolytic plating layer 214, and forming the circuit pattern 217 using the dry film.

There are many advantages to the above described embodiments. For example, using a polyimide bonding sheet that can absorb a heat change rate based on a thermal expansion coefficient of aluminum can prevent damage to a substrate despite harsh conditions of a drastic change in vibration and temperature, and thus, can improve reliability of a product. Additionally, formation of surface roughness of a base layer reduces the amount of time for manufacturing the PCB. Further, the cost for manufacturing the PCB is reduced using a relatively inexpensive aluminum.

The resulting PCB and method of manufacturing the PCB not only enables a reduction in a cost for manufacturing the PCB by applying an existing layering, plating, and circuit forming method, the resulting PCB has improved current carrying properties, heat dissipation characteristics, and bending strength.

Further still, the method of manufacturing the PCB is generalized, and can be applied in a wide variety of applications requiring implementation of various forms of circuits, circuit integration, and product simplification.

While the disclosure includes specifically described embodiments, those of ordinary skill in the art would appreciate that various changes in form and details can be made without departing from the spirit and scope of the claims and their equivalents. The embodiments described herein are to be considered to be exemplary, and not limiting. Descriptions of features or aspects in each embodiment are applicable to similar features or aspects in other embodiments. Suitable results can be achieved if the described techniques are performed in a different order, and/or if components in a described system, architecture, device, or circuit are combined in a different manner and/or replaced or supplemented by other components or their equivalents.

Therefore, the scope of the disclosure is defined not by the detailed description, but by the claims and their equivalents, and all variations within the scope of the claims and their equivalents are to be construed as being included in the disclosure.

What is claimed is:

1. A printed circuit board, comprising:
   a core made of an aluminum material;
   a bonding member positioned on opposite surfaces of the core;
   a base layer formed of an aluminum material bonded to the opposite surface of the core through the bonding member;
   a receiving hole extending through the core, the bonding member, and the base layer;
   a zinc substitution layer positioned on a surface of the base layer and a portion of the base layer exposed on an inner surface of the receiving hole; and
   a plating layer positioned on the zinc substitution layer, and having a circuit pattern.

2. The printed circuit board of claim 1, wherein:
   a metal layer is positioned on a portion of the bonding member exposed on the inner surface of the receiving hole;
   the zinc substitution layer is positioned on a portion of the inner surface of the receiving hole from which the metal layer is excluded; and
   the plating layer covers the metal layer.

3. The printed circuit board of claim 2, wherein:
   the plating layer is an electrolytic or electroless plating layer; and
   an electrolytic plating layer is positioned on the plating layer.

4. The printed circuit board of claim 3, wherein:
   the plating layer is positioned on the surface of the substitution layer from which the metal layer is excluded or covers a portion of the metal layer; and
   the electrolytic plating layer covers a portion of the metal layer on which the plating layer is excluded.

5. The printed circuit board of claim 1, wherein the core is formed of the aluminum material having a predetermined thickness and having a core pattern disposed thereon.

6. The printed circuit board of claim 1, wherein the core comprises:
   a core layer made of an aluminum material having a predetermined thickness and a core pattern formed thereon;
   a core bonding member positioned on the core layer; and
   a core base layer made of an aluminum material and bonded on opposite sides of the core layer through the core bonding member.

7. The printed circuit board of claim 6, further comprising:
   a circuit pattern on the core base layer; and
   an insulation layer is positioned on the core base layer.

8. The printed circuit board of claim 7, wherein the metal layer is positioned on portions of the bonding member, the core bonding member, and the insulation layer that are exposed on the inner surface of the receiving hole; and
   the plating layer is deposited on the metal layer.

9. The printed circuit board of claim 6, further comprising:
   an insulation layer positioned between the core and the bonding member;
   a metal layer positioned on portions of the core bonding member, the bonding member, and the insulation layer that are exposed on the inner surface of the receiving hole;

the substitution layer is positioned on a portion of the core base layer from which the metal layer is absent; and the plating layer is deposited on the metal layer.

10. The printed circuit board of claim 6, wherein the core further includes a receiving hole extending through the core layer.

11. The printed circuit board of claim 10, wherein the core layer has a surface roughness.

12. The printed circuit board of claim 1, comprising:
an insulation layer positioned on the circuit pattern;
a second bonding member positioned on the insulation layer;
a second base layer made of an aluminum material and bonded to the insulation layer through the second bonding member;
a second zinc substitution layer positioned on a surface of the second base layer; and
a second plating layer formed on the second substitution layer, the insulation layer, the second base layer, the second substitution layer, and the second plating layer being repetitively layered at least once; and
a second receiving hole extending though the insulation layer, the second base layer, the second substitution layer, and the second plating layer.

13. The printed circuit board of claim 12, further comprising:
a second metal layer positioned on portions of the bonding member, the insulation layer, and the second bonding member that are exposed on an inner surface of the second receiving hole;
the second zinc substitution layer being positioned on a portion of the second base layer from which the second metal layer is absent; and
the second plating layer being positioned on the second metal layer.

14. The printed circuit board of claim 1, wherein the core comprises:
a metal core layer made of an aluminum material having a predetermined thickness, and having a core pattern formed thereon;
a core bonding member positioned on opposite sides of the metal core layer;
a core base layer made of an aluminum material and bonded to the metal core layer on each of the opposite sides through the core bonding member;
a second core bonding member positioned on each of the opposite sides of the core base layer; and
a second core base layer made of an aluminum material and bonded to each of the core base layers through the second core bonding member.

15. A method of manufacturing a printed circuit board, comprising the steps of:
providing a core of an aluminum material;
positioning a bonding member on opposite sides of the core;
bonding a base layer formed of an aluminum material having a predetermined thickness to the core using the bonding member;
forming a receiving hole penetrating the core, the bonding member, and the base layer;
forming a zinc substitution layer by zincifying outer surfaces of the base layer and a portion of the base layer exposed on an inner surface of the receiving hole;
depositing a plating layer on the substitution layer; and
forming a predetermined circuit pattern on the plating layer.

16. The method of claim 15, further comprising the step of:
forming a metal layer on a portion of the bonding member exposed on the inner surface of the receiving hole.

17. The method of claim 16, wherein forming of the substitution layer includes forming the zinc substitution layer on a portion of the base layer from which the metal layer is absent, and the forming of the plating layer includes forming the plating layer to cover the metal layer.

18. The method of claim 17, wherein the forming of the plating layer includes:
forming a plating layer on a surface of the substitution layer using electrolytic or electroless plating; and
forming an electrolytic plating layer made of a cupric material on the plating layer using electrolytic plating.

19. The method of claim 18, wherein:
the plating layer is positioned on the surface of the substitution layer from which the metal layer is absent, or positioned to cover a portion of the metal layer; and
the electrolytic plating layer is positioned to cover a portion of the metal layer on which the plating layer is absent.

20. The method of claim 15, wherein the aluminum material of the core has a predetermined thickness and has a core pattern.

21. The method of claim 20, further comprising the step of performing a surface treatment on the core layer to create a surface roughness.

22. The method of claim 15, wherein providing the core includes the steps of:
providing a metal core layer made of an aluminum material having a predetermined thickness;
forming a core pattern on the metal core layer;
positioning a core bonding member on opposite surfaces of the metal core layer; and
bonding a core base layer made of an aluminum material on the opposite surfaces of the metal core layer.

23. The method of claim 22, wherein providing the core further includes the steps of:
forming a second circuit pattern on the core base layer; and
positioning an insulation layer on the core base layer.

24. The method of claim 22, wherein providing the core further includes the steps of:
positioning a second core bonding member on opposite surfaces of the core base layer; and
bonding a second core base layer made of an aluminum material to the opposite surfaces of the core base layer through the second core bonding member.

25. The method of claim 22, further including the steps of:
forming an insulation layer to fill the circuit pattern;
positioning a second bonding member on the insulation layer;
bonding a second base layer made of an aluminum material to the insulation layer through the second bonding member;
forming a second receiving hole that extends through the metal core layer, the bonding member, the base layer, the insulation layer, the second bonding member, and the second base layer;
forming a metal layer on a surface of the bonding member and a surface of the second bonding member that are exposed on an inner surface of the second receiving hole;
forming a zinc substitution layer by performing surface treatment to zincify a surface of the second base layer, and on portions of the second base layer, the base layer, and the insulation layer that are exposed to the inner surface of the second receiving hole apart from the metal layer;

forming a plating layer on the substitution layer using electrolytic or electroless plating; and forming a circuit pattern on the plating layer.

26. The method of claim 19, wherein the core pattern is at least one receiving hole penetrating the core layer.

27. The method of claim 26, further comprising the step of performing surface treatment on the core layer to create a surface roughness.

28. The method of claim 15, further comprising the steps of:

providing two secondary substrates having a circuit pattern;

positioning an insulation layer on one of the secondary substrates;

positioning the one of the secondary substrates on the insulation layer to create a layered secondary substrate;

positioning an insulation layer on at least one of the opposite surfaces of the layered secondary substrate;

positioning a second bonding member on the insulation layer;

bonding a second base layer made of an aluminum material to the insulation layer through the second bonding member;

forming a receiving hole that extends through the layered secondary substrate, the insulation layer, the second bonding member, and the second base layer;

positioning a metal layer on portions of the bonding member and the second bonding member that are exposed on an inner surface of the receiving hole;

forming a zinc substation layer by performing surface treatment to zincify a surface of the second base layer, and portions of the second base layer, the base layer, and the insulation layer that are exposed on the inner surface of the receiving hole, apart from the metal layer;

depositing a plating layer on the substitution layer using electrolytic or electroless plating; and forming a circuit pattern on the plating layer.

* * * * *